(12) United States Patent
Jung

(10) Patent No.: US 12,123,598 B2
(45) Date of Patent: Oct. 22, 2024

(54) PORTABLE STOVE

(71) Applicant: Chin Hu Jung, Norwood, NJ (US)

(72) Inventor: Chin Hu Jung, Norwood, NJ (US)

(*) Notice: Subject to any disclaimer, the term of this patent is extended or adjusted under 35 U.S.C. 154(b) by 498 days.

(21) Appl. No.: 17/433,612

(22) PCT Filed: Feb. 25, 2019

(86) PCT No.: PCT/KR2019/002282
§ 371 (c)(1),
(2) Date: Aug. 25, 2021

(87) PCT Pub. No.: WO2020/175716
PCT Pub. Date: Sep. 3, 2020

(65) Prior Publication Data
US 2022/0146106 A1 May 12, 2022

(51) Int. Cl.
*F24C 5/10* (2021.01)
*F23D 11/00* (2006.01)
(Continued)

(52) U.S. Cl.
CPC .................. *F24C 5/10* (2013.01); *F23N 1/02* (2013.01); *F24C 5/04* (2013.01); *F24C 5/16* (2013.01);
(Continued)

(58) Field of Classification Search
CPC ...... F23D 11/001; F23N 1/02; F23N 2235/12; F24C 15/107; F24C 5/04; F24C 5/10;
(Continued)

(56) References Cited

U.S. PATENT DOCUMENTS 2,501,627 A * 3/1950 Findley ..................... F23N 5/10
126/116 A
2,519,241 A * 8/1950 Findley ................... F23N 5/105
236/1 R
(Continued)

FOREIGN PATENT DOCUMENTS

JP 2018-048758 A 3/2018
KR 10-2007-0116918 12/2007

*Primary Examiner* — Michael G Hoang
*Assistant Examiner* — Logan P Jones
(74) *Attorney, Agent, or Firm* — CANTOR COLBURN LLP

(57) ABSTRACT

The present disclosure includes: a casing with an open top; a combustion compartment including: a combustion chamber disposed inside the casing to generate a blue flame-shaped flame by burning vegetable oil; a combustion cover enclosing the combustion chamber therein, and having an inner wall spaced apart from an outer wall of the combustion chamber by a predetermined distance to form a predetermined cavity; and an air chamber disposed below the combustion cover with a lower end of the combustion chamber being positioned above, wherein the air chamber supplies outside air toward the combustion chamber during combustion of the vegetable oil; an oil tank that supplies the vegetable oil to the combustion chamber; and a control unit that controls whether or not to drive the air chamber, the flow and supply pressure of the outside air, and whether or not to supply the vegetable oil and a supply amount of the vegetable oil.

6 Claims, 5 Drawing Sheets

(51) Int. Cl.
*F23N 1/02* (2006.01)
*F24C 5/04* (2021.01)
*F24C 5/16* (2006.01)
*F24C 5/18* (2006.01)
*F24C 5/20* (2021.01)
*F24C 15/10* (2006.01)
*F24C 15/14* (2006.01)
*H10N 10/13* (2023.01)
*F24C 5/14* (2006.01)

(52) U.S. Cl.
CPC .............. *F24C 5/20* (2013.01); *F24C 15/107* (2013.01); *H10N 10/13* (2023.02); *F23D 11/001* (2013.01); *F23N 2235/12* (2020.01); *F24C 5/14* (2013.01)

(58) Field of Classification Search
CPC ...... F24C 5/14; F24C 5/16; F24C 5/18; F24C 5/20; H10N 10/13; Y02B 40/00
See application file for complete search history.

(56) References Cited

U.S. PATENT DOCUMENTS

| | | | | |
|---|---|---|---|---|
| 2,627,263 | A * | 2/1953 | Anderson | F24C 5/02 |
| | | | | 126/38 |
| 2,928,386 | A * | 3/1960 | Keyt | F24C 5/20 |
| | | | | 126/38 |
| 4,773,847 | A * | 9/1988 | Shukla | F23D 11/44 |
| | | | | 431/46 |
| 2009/0025703 | A1* | 1/2009 | Van Der Sluis | H10N 10/00 |
| | | | | 165/59 |
| 2015/0000648 | A1* | 1/2015 | Jung | F24C 5/18 |
| | | | | 126/46 |
| 2015/0147708 | A1* | 5/2015 | Kornilov | F23D 14/84 |
| | | | | 431/329 |
| 2015/0219341 | A1* | 8/2015 | Yun | F23D 11/36 |
| | | | | 126/45 |
| 2016/0238258 | A1* | 8/2016 | Yun | F23D 5/18 |
| 2017/0231426 | A1* | 8/2017 | Barford | F24C 1/16 |
| | | | | 126/30 |

* cited by examiner

PORTABLE STOVE

CROSS-REFERENCE TO RELATED APPLICATIONS

This application is a national stage application of International Patent Application No. PCT/KR2019/002282 filed on Feb. 25, 2019, the entire contents of which are incorporated by reference herein.

TECHNICAL FIELD

The present disclosure relates to a portable stove, more particularly, to a portable oil burning stove, and more particularly, tol a portable stove capable of providing heat using vegetable oil such as palm oil and allowing complete combustion of the palm oil to minimize harmful components generated during heating of the vegetable oil.

BACKGROUND

Portable stoves are widely used for purposes of cooking and heating in remote places, and generally use propane, gas, charcoal or other combustible materials as a heating medium to provide sufficient heat to cook food.

As an example, Korean Utility Model Registration No. 20-0471688 (hereinafter referred to as Reference 1) discloses a portable stove that eliminates the inconvenience of having to prepare a large amount of heats which can be unnecessary, and eliminates concerns about safety accidents and increases convenience of use.

However, in the example of Reference 1, since heat is provided by using the combustible material described above, when the combustible material is heated, there is a problem that harmful components such as carbon monoxide are generated, which in turn pollutes the environment and may harm the health of users. In addition, considering that the use of some combustible materials is restricted in some parts of the world, the use of these materials is limited.

Accordingly, in recent years, portable stoves using wood rather than combustible materials are mainly used.

As an example, Korean Patent Registration No. 10-1750331 (hereinafter referred to as Reference 2) discloses a wood stove with improved combustion efficiency by improving the combustion structure and heat storage structure of the furnace.

However, according to the Reference 2, since the portable stoves using wood require a steady supply of wood that is cut to a certain size, damage to the forest is inevitable, and when the wood burns out, a by-product such as the remaining ash is generated, necessitating a process of removing the same, and as a result, a continuous use of the portable stove is impossible. In addition, when a large amount of wood is used, there is a problem in that the burnt charcoal plays a role in interfering with the inflow of oxygen, in which case it is not possible to continuously maintain a high temperature state.

SUMMARY

In order to solve the problems described above, the present disclosure has been devised in view of the background art described above, and it is an object of the present disclosure to provide a portable stove capable of providing heat using vegetable oil such as palm oil and allowing complete combustion of the palm oil to minimize harmful components generated during heating of the vegetable oil.

Further, it is another object of the present disclosure to provide a portable stove capable of quickly igniting the vegetable oil by supplying the vegetable oil in a form of a spray, and collecting the flame generated during ignition and discharging it to an upper part of the combustion compartment in a state where the intensity of the flame is maximized, to thus improve heating efficiency.

It should be understood, however, that the scope of the present disclosure is not limited thereto and that the objects and effects which can be understood from the solution means and the embodiments of the present disclosure are also included therein even if not explicitly mentioned.

According to an embodiment of the present disclosure for achieving the above object, the disclosure may include: a casing with an open top; a combustion compartment including: a combustion chamber disposed inside the casing to generate a blue flame-shaped flame by burning vegetable oil; a combustion cover enclosing the combustion chamber therein and having an inner wall spaced apart from an outer wall of the combustion chamber by a predetermined distance to form a predetermined cavity; and an air chamber disposed below the combustion cover with a lower end of the combustion chamber being positioned above, in which the air chamber supplies outside air toward the combustion chamber during combustion of the vegetable oil; an oil tank that supplies the vegetable oil to the combustion chamber; and a control unit that controls whether or not to drive the air chamber, the flow and supply pressure of the outside air, and whether or not to supply the vegetable oil and a supply amount of the vegetable oil.

According to an embodiment of the present disclosure, the combustion chamber may further include: a first through hole formed in a lower portion of the outer wall and penetrating therethrough so as to allow an inflow of the outside air and a movement of the flame during combustion of the vegetable oil; and a second through hole formed in an upper portion of the outer wall, through which the flame is flowed in and discharged.

According to an embodiment of the present disclosure, the first through hole may include two first through holes at positions opposite to each other on the outer wall, and be configured to have different heights from each other and a diameter of $3/40$ inches with respect to a diameter of the outer wall, and the second through hole may be configured to have a diameter of $1/32$ inch with respect to the diameter of the outer wall and includes 56 second through holes along a circumferential surface of the outer wall.

According to an embodiment of the present disclosure, the combustion chamber may further include: a heat collecting member that collects heat generated during combustion of the vegetable oil; and a thermoelectric pad formed at a lower end of the heat collecting member and converts the collected heat into electrical energy.

According to an embodiment of the present disclosure, the combustion chamber may further include an ignition means for improving efficiency of ignition and combustion of the vegetable oil.

According to an embodiment of the present disclosure, the air chamber may further include: a fan member that supplies outside air toward the combustion chamber under a control of the control unit; a heat sink that discharges heat generated in the combustion chamber; and a battery that stores electrical energy.

According to an embodiment of the present disclosure, the oil tank may include: a supply line connected to the combustion chamber and supplying vegetable oil; a supply amount control sensor disposed inside the combustion chamber and sensing an amount of supply of the vegetable oil; a control valve that controls opening and closing of the supply line according to a sensing result of the supply amount control sensor; and a supply nozzle that supplies the vegetable oil in a form of a spray.

According to an embodiment of the present disclosure, the casing may include a seating cover including a discharge hole at a center through which a flame is discharged, in which the seating cover may further include: a mounting means formed on an upper portion of the seating cover for cooking utensils to be seated thereon; and a blocking plate that blocks the flame generated from the combustion compartment from being discharged to an outside and allowing only heat to be discharged to the outside.

According to the embodiments of the present disclosure described above, by providing heat using vegetable oil such as palm oil and allowing complete combustion of the palm oil, it is possible to minimize harmful components generated during heating of the vegetable oil.

Further, according to the embodiments of the present disclosure, by quickly igniting the vegetable oil by supplying the vegetable oil in a form of a spray, and collecting the flame generated during ignition and discharging it to an upper part of the combustion compartment in a state where the intensity of the flame is maximized, it is possible to improve heating efficiency.

Further, the various and beneficial advantages and effects of the present disclosure are not limited to those described above, and can be more easily understood in the course of describing a specific embodiment of the present disclosure.

DETAILED DESCRIPTION OF THE DISCLOSURE

An embodiment is provided, which may include:
a casing with an open top; a combustion compartment including:
a combustion chamber disposed inside the casing to generate a blue flame-shaped flame by burning vegetable oil;
a combustion cover enclosing the combustion chamber therein, and having an inner wall spaced apart from an outer wall of the combustion chamber by a predetermined distance to form a predetermined cavity; and an air chamber disposed below the combustion cover with a lower end of the combustion chamber being positioned above, wherein the air chamber supplies outside air toward the combustion chamber during combustion of the vegetable oil; an oil tank that supplies the vegetable oil to the combustion chamber; and
a control unit that controls whether or not to drive the air chamber, the flow and supply pressure of the outside air, and whether or not to supply the vegetable oil and a supply amount of the vegetable oil.

DETAILED DESCRIPTION

Figure 1:
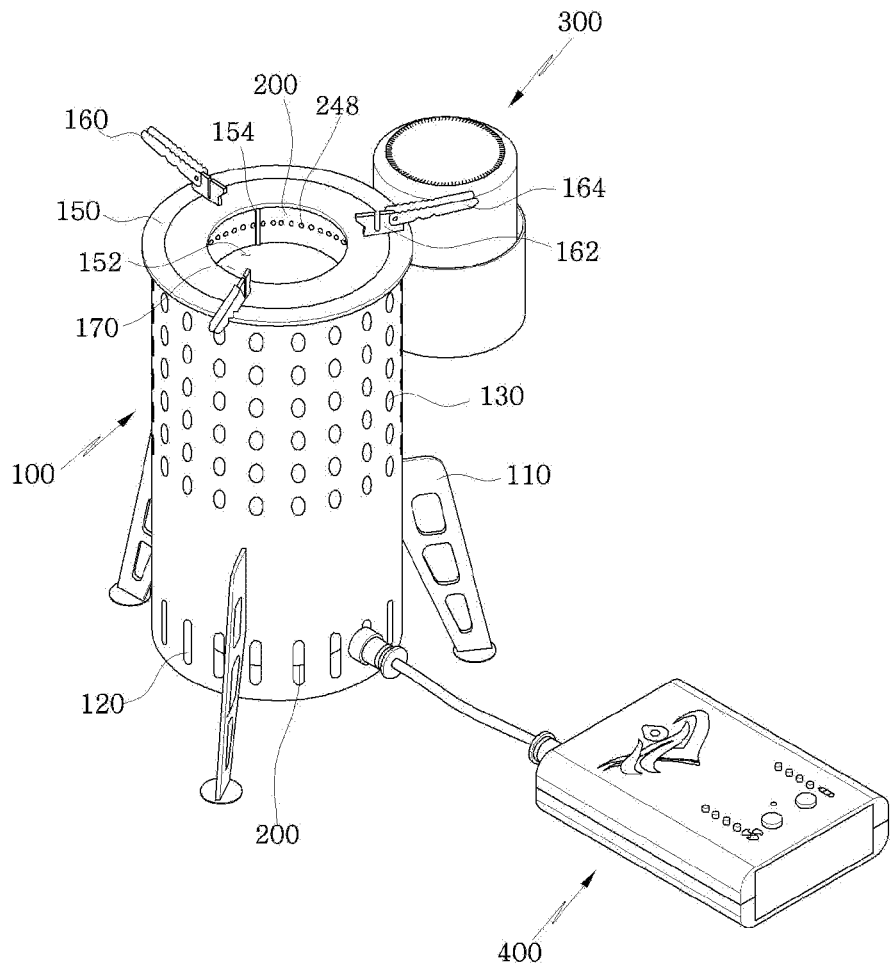
FIG. 1 is a perspective view illustrating a portable stove according to an embodiment of the present disclosure.
Figure 2:
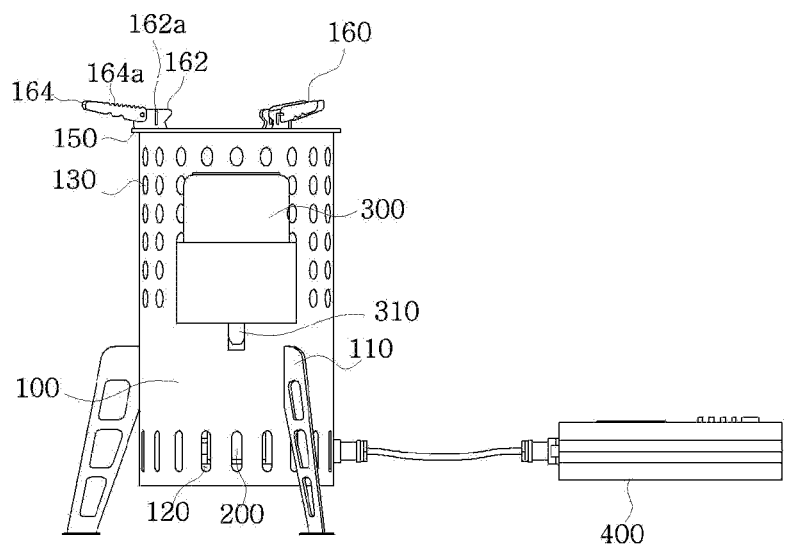
FIG. 2 is a front view illustrating the portable stove according to an embodiment of the present disclosure.
Figure 3:
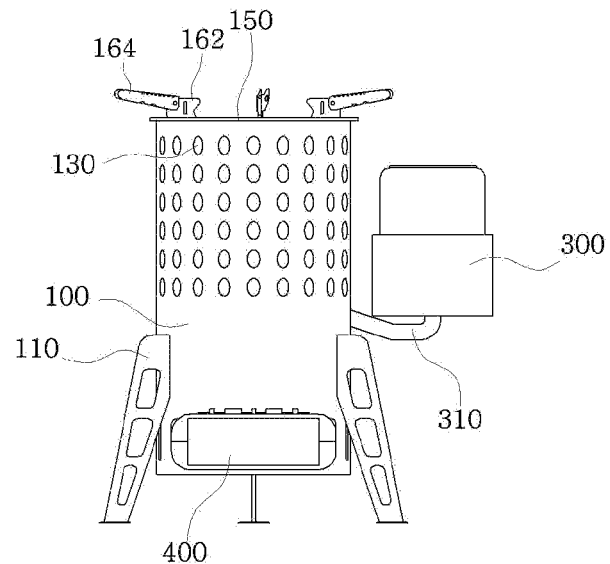
FIG. 3 is a side view illustrating the portable stove according to an embodiment of the present disclosure.
Figure 4:
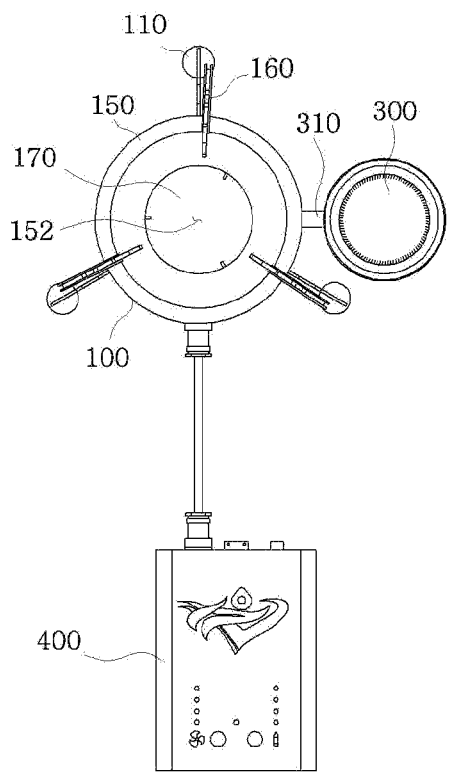
FIG. 4 is a plan view illustrating the portable stove according to an embodiment of the present disclosure.
Figure 5:
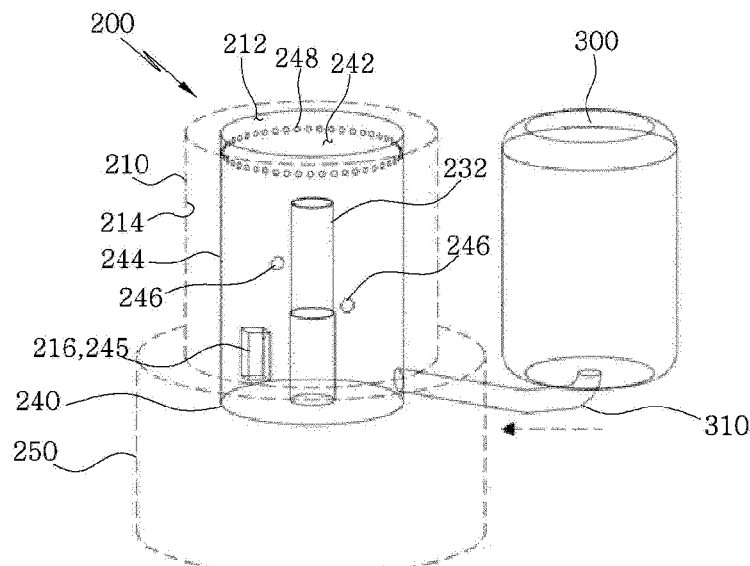
FIGS. 5 and 6 are perspective views schematically illustrating a combustion compartment of the portable stove according to an embodiment of the present disclosure.
Figure 6:
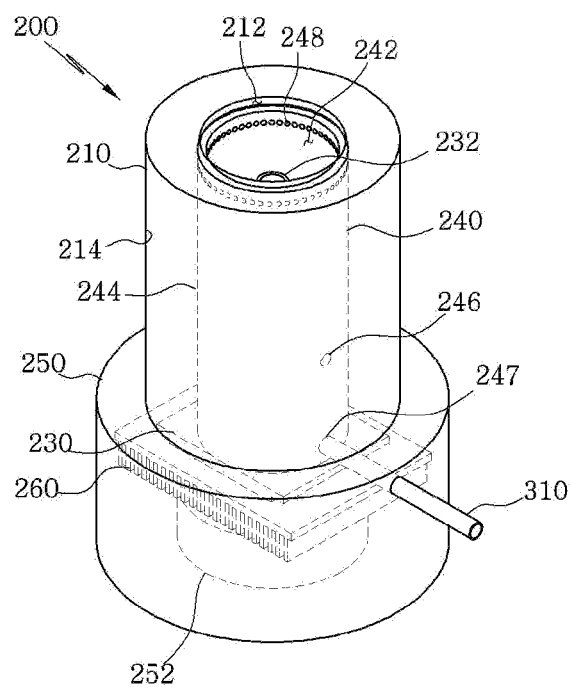
Figure 7:
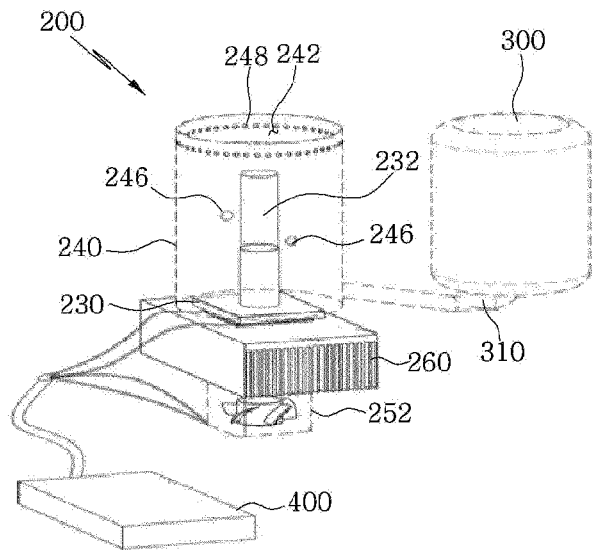
FIG. 7 is a perspective view schematically illustrating an internal configuration of a combustion chamber and an air chamber of the combustion compartment according to an embodiment of the present disclosure.
Figure 8:
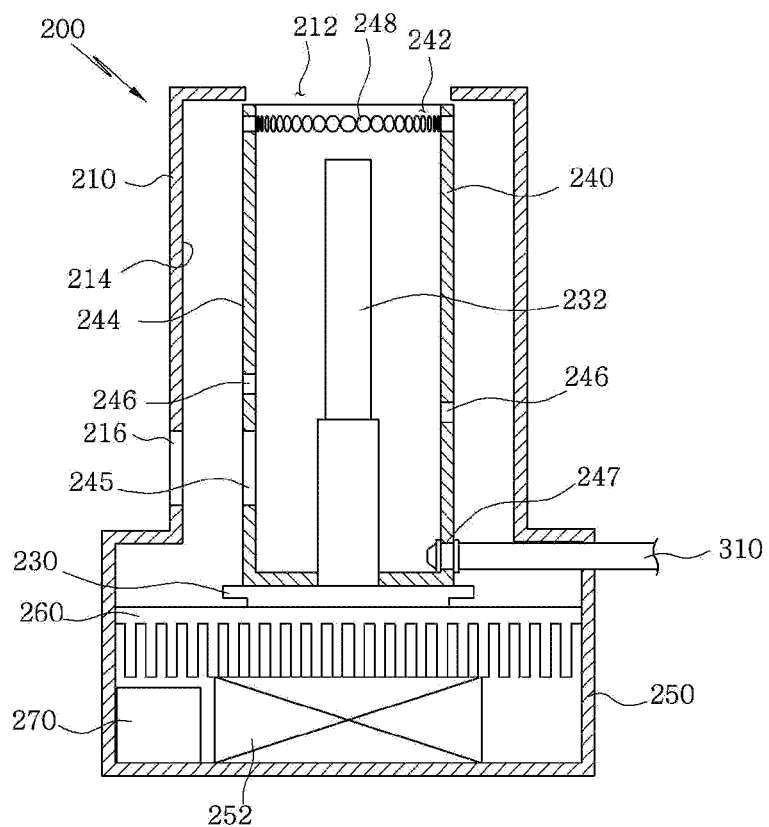
FIGS. 8 and 9 are cross-sectional views schematically illustrating the combustion compartment of the portable stove according to an embodiment of the present disclosure.
Figure 9:
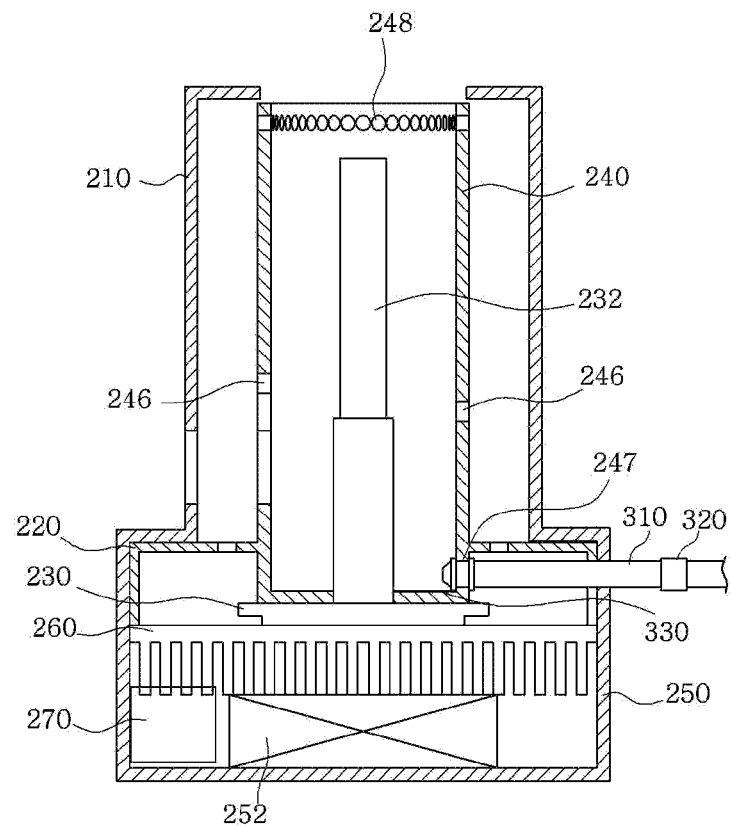
Figure 10:
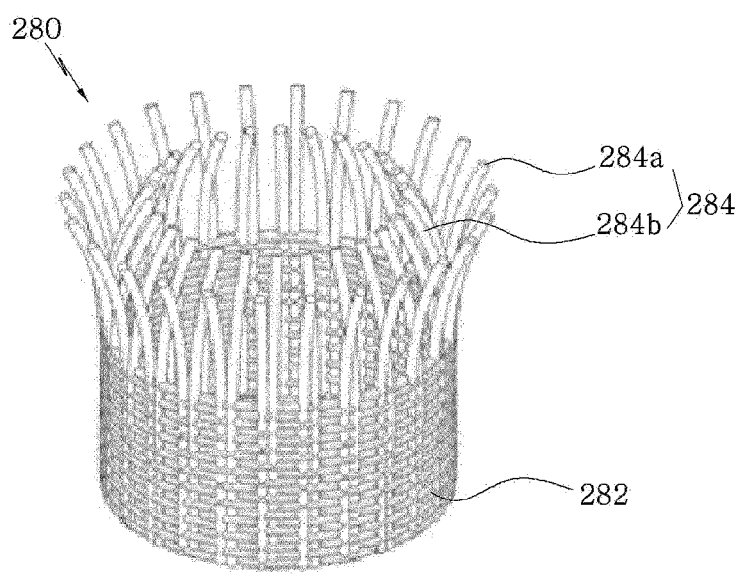
FIG. 10 is a perspective view illustrating an ignition frame of the portable stove according to an embodiment of the present disclosure.

FIGS. 1 to 4 are views illustrating a portable stove according to an embodiment of the present disclosure, FIGS. 5 and 6 are perspective views schematically illustrating a combustion compartment of the portable stove according to an embodiment of the present disclosure, FIG. 7 is a perspective view schematically illustrating an internal configuration of a combustion chamber and an air chamber of the combustion compartment according to an embodiment of the present disclosure, FIGS. 8 and 9 are cross-sectional views schematically illustrating the combustion compartment of the portable stove according to an embodiment of the present disclosure, and FIG. 10 is a perspective view illustrating an ignition frame of the portable stove according to an embodiment of the present disclosure.

As illustrated, the portable stove according to the present disclosure is configured to include a casing 100 from which a blue flame-shaped flame is discharged to an upper portion, a combustion compartment 200 disposed inside the casing 100 to generate a blue flame-shaped flame when vegetable oil is supplied, an oil tank 300 configured to supply a certain amount of vegetable oil to the combustion compartment 200, and a control unit 400 configured to control an amount of supply of the vegetable oil and an intensity of the flame.

The casing 100 includes the combustion compartment 200 contained therein, the upper portion opened to allow the discharge of the blue flame-shaped flame generated from the combustion compartment 200, and a support leg 110 that supports the portable stove at the lower portion.

In addition, the casing 100 includes a plurality of heat dissipation grooves formed along a circumferential surface. The heat dissipation grooves include a plurality of upper heat dissipation grooves 130 spaced apart from each other by a predetermined interval along an upper circumferential surface of the casing 100, and a plurality of lower heat dissipation grooves 120 formed along a lower circumferential surface of the casing 100.

In this case, the upper heat dissipation grooves 130 may be formed in a plurality of rows in an axial direction of the casing 100, and thus, the heat generated in the combustion compartment 200 can be efficiently discharged.

In addition, the casing 100 includes a seating cover 150 with an opened upper end to receive various cooking tools to be mounted thereon.

The seating cover 150 is formed of a circular panel having a discharge hole 152 penetrating a central portion, through which the flame is discharged. In addition, the seating cover 150 includes a mounting means 160 for allowing the cooking tools and the like to be fixed at a position spaced apart from the seating cover 150 by a predetermined distance.

The mounting means 160 includes a plurality of portions including fixed panels 162 coupled to the upper portion of the seating cover 150 at equal intervals, and mounting panels 164 rotatably coupled to the fixed panels 162 and configured for a cooking tool to be seated thereon.

In this example, the fixed panels 162 and the mounting panels 164 are rotationally coupled by a rotation means such as a hinge pin and the like.

The fixed panel 162 includes an open top into which the mounting panel 164 is inserted, and a fixing groove 162a through which a fixing pin or the like is inserted and passed such that the mounting panel 164 is fixed in an inserted state.

In addition, the mounting panel 164 includes a mounting protrusion 164a formed on an upper surface to be contacted with a lower surface of the cooking tool and to improve fixing force with the cooking tool.

Meanwhile, the seating cover 150 further includes a blocking plate 170 that blocks the generated flame from being discharged to the outside from the combustion compartment 200 and allows only the heat to be discharged to the outside. That is, the blocking plate 170 closes an opening 212 and a flame outlet 242 formed in the combustion compartment 200.

In this case, the seating cover 150 may further include a connecting bar 154 connecting the blocking plate 170, and there is a plurality of connecting bars 154 spaced apart from each other by a predetermined interval along an inner circumferential surface of the discharge hole 152.

The combustion compartment 200 is provided inside the casing 100 to burn a certain amount of vegetable oil supply to generate a blue flame-shaped flame while providing a predetermined heat, and it includes a combustion cover 210, a combustion chamber 240, and an air chamber 250.

The combustion cover 210 forms an outer shape of the combustion compartment 200, and includes the combustion chamber 240 provided therein for burning of the vegetable oil, and the air chamber 250 formed therebelow to supply a certain amount of air and collect the flame and heat generated in the combustion chamber 240 to produce a predetermined electric power, during combustion of the vegetable oil.

This combustion cover 210 includes the opening 212 formed in the upper portion and opened to communicate with the discharge hole 152 of the casing 100, and an inner wall 214 spaced apart by a predetermined distance from an outer peripheral surface of the combustion chamber 240 formed therein.

In this case, the combustion chamber 240 includes an outer wall 244 that forms the outer peripheral surface and is spaced apart from the inner wall 214 by a predetermined interval, thus forming a cavity that occupies a predetermined space between the inner wall 214 and the outer wall 244, and the cavity serves as a passage allowing the flame and heat generated during combustion of the vegetable oil to be moved upward from a first through hole 246 to a second through hole 248 formed in the combustion chamber 240.

In addition, the combustion cover 210 according to the present disclosure includes an ignition unit 216 formed on one side of a lower portion, on which an ignition device is mounted to ignite for the combustion of the vegetable oil when the vegetable oil is supplied to the combustion chamber 240.

The ignition device may include a heating element for burning the vegetable oil, and the heating element may include an electric resistance coil inserted into the combustion chamber 240 to heat the vegetable oil.

As illustrated in FIGS. 5 to 8, the combustion chamber 240 is provided inside the combustion cover 210, and configured such that the outer wall 244 forming the outer peripheral surface is spaced apart from the inner wall 212 of the combustion cover 210 by the predetermined distance, and configured to burn the vegetable oil when it is supplied, to thus produce a blue flame-shaped flame and heat generated from the flame.

The combustion chamber 240 includes a flame discharge port 242 that emits the flame to the upper end, and an ignition hole 245 formed on one side of the lower portion and positioned coaxially with the ignition unit 216.

Accordingly, when the vegetable oil is supplied, the ignition device mounted on the ignition hole 245 is operated to burn the vegetable oil, thereby generating flame and heat generated from the flame.

In addition, the combustion chamber 240 according to the present disclosure includes, formed on the outer wall 244, the first through hole 246 to allow a certain amount of air to flow in during combustion of the vegetable oil and also to allow the combustion flame to move upward at the same time, and the second through hole 248 to allow the flame moved upward through the first through hole 246 to flow in and discharged toward the flame outlet 242.

In an example, two first through-holes 246 are formed through a lower portion of the outer wall 244 at positions opposite to each other respectively, with a diameter of 3/40 inches relative to the diameter of the outer wall 244.

In addition, one of the two first through holes 246 is positioned at a height of 4.75 inches from the bottom of the combustion chamber 240, and the other is formed at a higher position than the position of this one first through hole 246.

That is, the first through holes 246 are formed to have different heights on the outer wall 244 of the combustion chamber 240.

In addition, the second through hole 248 has a diameter of 1/32 inch with respect to the diameter of the outer wall 244, and includes 56 holes along the circumferential surface of the outer wall 244.

That is, the flame passing through the first through-holes 246 is flowed into the second through-holes 248 and is discharged through the flame outlet 242, so that the emitted flame is not emitted in a way that is concentrated in one location, and uniform emission in a circular fashion can be achieved.

The outer wall 244 preferably has a diameter of 3.15 inches, but may have various diameters in accordance with the size of the portable stove.

In addition, the combustion chamber 240 includes an oil supply hole 247 connected to the oil tank 300 to be supplied with a predetermined amount of vegetable oil. The oil supply hole 247 is configured to be closely coupled to a supply line 310 provided in the oil tank 300.

In this example, a supply amount control sensor 330 configured to control the amount of supply of the vegetable oil may be further provided at a lower end of the oil supply hole 247.

The supply amount control sensor 330 is configured to prevent excessive supply of the vegetable oil, and may be configured to control the opening/closing operation of a control valve 320 provided in the supply line 310 to be described below.

However, the present disclosure is not limited to the above, and the supply amount control sensor 330 may be configured to sense the amount of supply of the vegetable oil supplied into the combustion chamber 240, and send the sensed result to the control unit 400, so that the control unit 400 controls the opening/closing operation of the control valve 320.

Meanwhile, inside the combustion chamber 240, a heat collecting member 232 for collecting the heat generated during combustion of the vegetable oil is further provided, and a thermoelectric pad 230 for converting the collected heat into electrical energy may be provided at a lower end of the heat collecting member 232.

In this case, the thermoelectric pad 230 is configured to store the changed electrical energy in a battery 270 provided in the air chamber 250 to be described below.

The thermoelectric pad 230 may further include a heat collecting means for collecting not only the heat collected by the heat collecting member 232, but also the heat emitted from the combustion compartment 200 to convert it into electrical energy.

Such a thermoelectric pad may be made of a conventional EA thermoelectric generator or a Seebeck generator, but is not limited thereto.

As illustrated in FIG. 9, the combustion chamber 240 according to the present disclosure configured as described above further includes a base part 220 at the lower end, which separates the cavity formed between the inner wall 214 and the outer wall 244 from the air chamber 250 to be described below, to prevent the flame from entering into the air chamber 250 and allows only heat to be emitted.

In this case, it is preferable that the base part 220 is formed with a plurality of communication holes such that outside air supplied from the air chamber 250 can be introduced into the combustion chamber 240 through the first through hole 246.

In addition, as illustrated in FIG. 10, the combustion chamber 240 is provided with an ignition means 280 as an ignition element to improve the ignition of the vegetable oil and to improve the combustion efficiency of the vegetable oil.

The ignition means 280 may be configured to be enclosed in the combustion chamber 240, and may preferably be a wick assembly or a related electrical resistance ignition element.

The ignition means 280 includes an ignition unit 282 forming a lower end, which is configured with a grid pattern and configured to be immersed in the vegetable oil supplied from the supply line 310, and to ignite the immersed vegetable oil by the ignition device, and a handle portion 284 extending above the ignition portion 282 and concentrating the flame generated during combustion of the vegetable oil to the center of the combustion chamber 240.

The ignition unit 282 preferably includes ceramic fibers so as to be saturated with the vegetable oil by immersion.

The ignition means 280 may be detachably provided inside the combustion chamber 240. Accordingly, after ignition, only the ignition means 280 may be separately detached from the combustion chamber 240.

In addition, in the present disclosure, the air chamber 250 is provided, which supplies outside air toward the combustion chamber 240 during combustion of the vegetable oil to improve combustion efficiency.

The air chamber 250 is integrally configured with the lower end of the combustion cover 210, while having the lower end of the combustion chamber 240 positioned inside the upper side, and includes a fan member 252 therein, such that the outside air is sucked and supplied toward the combustion chamber 240 under the control of the control unit 400 so that the vegetable oil is completely burned.

In this case, the fan member 252 may be configured to be positioned under the thermoelectric pad 230. That is, the thermoelectric pad 230 may also be configured to be positioned inside the air chamber 250, but embodiments are not limited thereto.

In addition, the fan member 252 preferably supplies outside air at a predetermined pressure to prevent inflow of the flame generated in the combustion chamber 240 when the outside air is supplied. The flame is moved upward by the pressure of the outside air supplied from the fan member 252.

In addition, the air chamber 250 further includes a heat sink 260 provided between the thermoelectric pad 230 and the fan member 252 to allow the heat generated in the combustion chamber 240 to be dissipated.

In addition, the air chamber 250 includes the battery 270 that stores electrical energy generated by the thermoelectric pad 230 and supplies the stored electrical energy to a place of use such as the fan member 252 under the control of the control unit 400.

The battery 270 may preferably be a 12 volt rechargeable battery, and may be configured as a rechargeable type capable of being charged with power from an external power source, and may include a cable for charging.

The oil tank 300 is configured to supply the vegetable oil into the combustion chamber 240 such that a blue flame-shaped flame can be generated, and includes the supply line 310 for supplying the vegetable oil, the control valve 320 provided on the supply line 310 to control whether or not to supply the vegetable oil, and the supply amount control sensor 330 disposed inside the combustion chamber 240 to sense the supply amount of the vegetable oil.

In this example, the present disclosure has been described by referring to an example where the vegetable oil is used as the main raw material, but the present disclosure is not limited thereto, and it goes without saying that any conventional oil including palm oil may be used as a fuel.

In addition, the supply line 310 further includes a supply nozzle formed at its tip to supply the vegetable oil into the combustion chamber 240.

In this case, the supply nozzle is configured such that the vegetable oil can be supplied while forming fine spray or mist spray. That is, by allowing combustion to take place in a state in which particles of the vegetable oil are minimized, it is possible to further maximize the efficiency of initial ignition and combustion, and as a result, complete combustion of vegetable oil can be achieved, thereby minimizing the generation of impurities or harmful components.

The oil tank 300 described above is configured at a position higher than the position of the casing 100 and the combustion compartment 200 such that the stored vegetable oil can be supplied by its own weight.

The control unit 400 is configured to control whether or not to drive the fan member 252, and the flow and supply pressure of air, and in conjunction with the supply amount control sensor 330, control whether to open or close the control valve 320 and also the degree of opening and closing.

The portable stove according to the present disclosure configured as described above may further include an electric system including a solar panel.

SEQUENCE LIST FREE TEXT

| | |
|---|---|
| 100: casing | 110: support leg |
| 120: lower dissipation hole | 130: upper dissipation hole |
| 150: seating cover | 160: mounting means |
| 170: blocking plate | 200: combustion compartment |
| 210: combustion cover | 220: base part |
| 230: thermoelectric pad | 240: combustion chamber |

| | |
|---|---|
| 250: air chamber | 260: heat sink |
| 270: battery | 280: ignition means |
| 300: oil tank | 310: supply line |
| 320: control valve | 330: supply amount control sensor |
| 400: control unit | |

What is claimed is:

1. A portable stove comprising
a casing with an open top;
a combustion compartment including a combustion chamber disposed inside the casing to generate a blue flame-shaped flame by burning vegetable oil;
an ignition structure disposed within the combustion chamber configured to efficiency of ignition and combustion of the vegetable oil;
a combustion cover enclosing the combustion chamber therein, and having an inner wall spaced apart from an outer wall of the combustion chamber by a predetermined distance to form a predetermined cavity; and
an air chamber disposed below the combustion cover with a lower end of the combustion chamber being positioned above, wherein the air chamber supplies outside air toward the combustion chamber during combustion of the vegetable oil;
a seating cover disposed on the casing including a discharge hole at a center through which a flame is discharged, the seating cover comprising a mounting structure formed on an upper portion thereof configured to have cooking utensils seated thereon, and a circular blocking plate configured to close an opening and a flame outlet formed in the combustion compartment to block the flame generated from the combustion compartment from being discharged to an outside and allowing only heat to be discharged to the outside;
an oil tank that supplies the vegetable oil to the combustion chamber; and
a controller,
wherein the controller is configured to control whether or not to drive the air chamber, the flow and supply pressure of the outside air, and whether or not to supply the vegetable oil and a supply amount of the vegetable oil, and
wherein the ignition structure comprises a lower portion comprising a cylindrically shaped grid pattern and an upper portion comprising a plurality of curved finger-shaped structures extending upward and radially inward from the lower portion and terminating at a free end.

2. The portable stove according to claim 1, wherein the combustion chamber further includes
a first through hole formed in a lower portion of the outer wall and penetrating therethrough so as to allow an inflow of the outside air and a movement of the flame during combustion of the vegetable oil; and
a second through hole formed in an upper portion of the outer wall, through which the flame is flowed in and discharged.

3. The portable stove according to claim 2, wherein the first through hole includes two first through holes at positions opposite to each other on the outer wall, and has different heights from each other and a diameter of 340 inches with respect to a diameter of the outer wall, and
the second through hole has a diameter of 132 inch with respect to the diameter of the outer wall and includes 56 second through holes along a circumferential surface of the outer wall.

4. The portable stove according to claim 2, wherein the combustion chamber further includes
a heat collecting member that collects heat generated during combustion of the vegetable oil; and
a thermoelectric pad formed at a lower end of the heat collecting member and converts the collected heat into electrical energy.

5. The portable stove according to claim 1, wherein the air chamber further includes
a fan member that supplies outside air toward the combustion chamber under a control of the controller;
a heat sink that discharges heat generated in the combustion chamber; and
a battery that stores electrical energy.

6. The portable stove according to claim 1, wherein the oil tank includes
a supply line connected to the combustion chamber and supplying vegetable oil;
a supply amount control sensor disposed inside the combustion chamber and sensing an amount of supply of the vegetable oil;
a control valve that controls opening and closing of the supply line according to a sensing result of the supply amount control sensor; and
a supply nozzle that supplies the vegetable oil in a form of a spray.

\* \* \* \* \*